US009349219B2

(12) United States Patent
Schrag et al.

(10) Patent No.: US 9,349,219 B2
(45) Date of Patent: May 24, 2016

(54) 3D SCENE OBJECT SWITCHING SYSTEM

(75) Inventors: John Vincent Schrag, Toronto (CA); Veronica Lynne Meuris, Burlington (CA)

(73) Assignee: AUTODESK, INC., San Rafael, CA (US)

( * ) Notice: Subject to any disclaimer, the term of this patent is extended or adjusted under 35 U.S.C. 154(b) by 365 days.

(21) Appl. No.: 11/327,373

(22) Filed: Jan. 9, 2006

(65) Prior Publication Data

US 2007/0159477 A1 Jul. 12, 2007

(51) Int. Cl.

| | |
|---|---|
| ***G06F 3/048*** | (2013.01) |
| ***G06T 19/20*** | (2011.01) |
| *G06T 19/00* | (2011.01) |
| *G06F 17/50* | (2006.01) |
| *G06T 11/60* | (2006.01) |

(52) U.S. Cl.

CPC ................. *G06T 19/20* (2013.01); *G06F 3/048* (2013.01); *G06F 17/50* (2013.01); *G06T 11/60* (2013.01); *G06T 19/00* (2013.01); *G06T 2219/016* (2013.01); *G06T 2219/2004* (2013.01); *G06T 2219/2012* (2013.01); *G06T 2219/2016* (2013.01); *G06T 2219/2021* (2013.01); *G06T 2219/2024* (2013.01)

(58) Field of Classification Search

CPC ......... G09T 11/60; G09T 19/00; G09T 19/20; G06F 3/048; G06F 17/50; G06T 11/60; G06T 19/00; G06T 19/20; G06T 2219/2012; G06T 2219/2016; G06T 2219/2021; G06T 2219/2024; G06T 2219/2004

USPC ................... 345/419, 594, 630; 715/765, 836

See application file for complete search history.

(56) References Cited

U.S. PATENT DOCUMENTS

| | | | | |
|---|---|---|---|---|
| 5,601,431 | A * | 2/1997 | Howard | 434/79 |
| 5,986,675 | A * | 11/1999 | Anderson et al. | 345/473 |
| 5,999,185 | A * | 12/1999 | Kato et al. | 345/420 |
| 6,091,422 | A * | 7/2000 | Ouaknine et al. | 345/419 |
| 6,188,403 | B1 * | 2/2001 | Sacerdoti et al. | 715/764 |
| 6,195,098 | B1 * | 2/2001 | Brittain et al. | 345/422 |
| 6,275,935 | B1 * | 8/2001 | Barlow et al. | 713/182 |
| 6,326,964 | B1 * | 12/2001 | Snyder et al. | 345/419 |
| 6,329,994 | B1 * | 12/2001 | Gever et al. | 345/473 |
| 6,414,679 | B1 * | 7/2002 | Miodonski et al. | 345/420 |
| 6,421,050 | B1 * | 7/2002 | Ruml et al. | 345/426 |
| 6,426,757 | B1 * | 7/2002 | Smith et al. | 345/634 |
| 6,459,435 | B1 * | 10/2002 | Eichel | 345/588 |
| 6,476,802 | B1 * | 11/2002 | Rose et al. | 345/419 |
| 6,518,989 | B1 * | 2/2003 | Ishikawa | 715/848 |
| 6,556,775 | B1 * | 4/2003 | Shimada | 386/241 |
| 6,570,578 | B1 * | 5/2003 | Smirnov et al. | 345/629 |
| 6,664,972 | B2 * | 12/2003 | Eichel et al. | 345/582 |
| 6,680,749 | B1 * | 1/2004 | Anderson et al. | 348/231.99 |

(Continued)

*Primary Examiner* — Patrick Riegler

(74) *Attorney, Agent, or Firm* — Artegis Law Group, LLP

(57) ABSTRACT

A system that allows a user to create a lineup of alternatives as controls for a part of a 3D scene by selecting scene contents and designating a lineup alternative control to contain or receive the contents. Once the alternatives are created, the lineups are provided in a graphical user interface (GUI) that displays each alternative as a compressed image of the scene containing the corresponding alternative. The user can click between the alternatives by selecting a desired button so that only the alternative selected in that lineup is shown in the scene. The user can create multiple lineups, each for a different part or overlapping parts of the scene, for changing the materials in a scene, and/or for positioning objects in a scene.

8 Claims, 21 Drawing Sheets

(56) References Cited

U.S. PATENT DOCUMENTS

| | | | | |
|---|---|---|---|---|
| 6,924,800 | B2 * | 8/2005 | Iwata | G06T 19/20 345/419 |
| 6,931,600 | B1 * | 8/2005 | Pittman | 715/767 |
| 7,062,722 | B1 * | 6/2006 | Carlin et al. | 715/850 |
| 7,417,646 | B1 * | 8/2008 | Larsen | 345/619 |
| 7,444,595 | B2 * | 10/2008 | Fournie | 715/763 |
| 7,559,036 | B1 * | 7/2009 | Buck | 715/834 |
| 7,703,036 | B2 * | 4/2010 | Satterfield et al. | 715/777 |
| 2001/0019332 | A1 * | 9/2001 | Fisher | 345/582 |
| 2001/0043219 | A1 * | 11/2001 | Robotham et al. | 345/474 |
| 2002/0030689 | A1 * | 3/2002 | Eichel et al. | 345/588 |
| 2002/0033839 | A1 * | 3/2002 | Elber et al. | 345/700 |
| 2002/0093538 | A1 * | 7/2002 | Carlin | 345/778 |
| 2002/0140740 | A1 * | 10/2002 | Chen | 345/810 |
| 2003/0028432 | A1 * | 2/2003 | Troyansky et al. | 705/14 |
| 2003/0107585 | A1 * | 6/2003 | Samuelson | 345/629 |
| 2003/0139840 | A1 * | 7/2003 | Magee et al. | 700/133 |
| 2003/0184544 | A1 * | 10/2003 | Prudent | 345/419 |
| 2004/0004626 | A1 * | 1/2004 | Ida et al. | 345/626 |
| 2004/0068423 | A1 * | 4/2004 | Shaw | 705/3 |
| 2004/0239699 | A1 * | 12/2004 | Uyttendaele et al. | 345/716 |
| 2005/0039176 | A1 * | 2/2005 | Fournie | 717/156 |
| 2005/0081161 | A1 * | 4/2005 | MacInnes et al. | 715/765 |
| 2005/0091008 | A1 * | 4/2005 | Green et al. | 703/1 |
| 2005/0151743 | A1 * | 7/2005 | Sitrick | 345/473 |
| 2005/0195157 | A1 * | 9/2005 | Kramer et al. | 345/156 |
| 2005/0223328 | A1 * | 10/2005 | Ashtekar et al. | 715/706 |
| 2005/0225566 | A1 * | 10/2005 | Kojo | 345/629 |
| 2005/0231513 | A1 * | 10/2005 | LeBarton et al. | 345/473 |
| 2005/0231530 | A1 * | 10/2005 | Liang et al. | 345/619 |
| 2005/0253839 | A1 * | 11/2005 | Bugaj et al. | 345/418 |
| 2006/0106634 | A1 * | 5/2006 | Brauer et al. | 705/1 |
| 2007/0103490 | A1 * | 5/2007 | Foster | 345/634 |
| 2007/0262984 | A1 * | 11/2007 | Pruss | 345/420 |

* cited by examiner

3D SCENE OBJECT SWITCHING SYSTEM

BACKGROUND OF THE INVENTION

1. Field of the Invention

The present invention is directed to a system for switching alternatives for a model in a scene so that different versions of the model can be easily presented and, more particularly, to a system that allows a user to select components of alternatives of a model, arrange them in categories and easily swap them in the scene, or to similarly swap different material assignments or positionings of models in the scene.

2. Description of the Related Art

In the world of product development there can often be different configurations for the components of a three-dimensional (3D) product. For example, an automobile can be purchased with several different style wheels or wheel covers, such a star spoke design, a four point spoke design, a solid wheel cover design, etc. A designer often needs to view a 3D model of the product with these alternate configurations. Similarly, the same model may need to be viewed with different materials applied (a "color study") or in different positions (such as an "exploded view"). One solution is to construct different 3D scenes of the various alternatives. This requires that multiple scenes be constructed, a time consuming task, and then sequentially loaded in and out of the current view, a tedious process that can take an irritating amount of time. The user must manually implement the representation, construction, and mutual exclusion of the 3D design alternatives. And because the different alternatives are often independent, the number of scenes that need to be created can grow quickly (every arrangement of parts in every possible color). In the 2D world paint layers can be used in paint/image processing programs to construct or overlay options. In the 3D world there is a similar concept of layers, which is a way to turn the visibility of groups of objects on and off one at a time, but no explicit mechanism exists for mutually excluding other options when a particular alternative is shown, nor for managing independent switching of parts, materials, and positions.

Because of these problems, users of visualization software need a way to manage the display and content of alternate configurations of products. They need a way to quickly and independently switch between different designs or options within a design, without needing to build many copies of the same model. They also need some way of keeping track of which alternatives are being displayed.

SUMMARY OF THE INVENTION

It is an aspect of the system described herein to provide a system capable of assisting in the management of the display and content of alternate configurations of products.

It is another aspect to provide a system that indicates to the user what alternatives are being displayed.

It is another aspect to provide a system that creates sets of alternatives (lineups), which can independently switch the visibility of items; the materials displayed on those items; and the positions of the items in the scene.

It is also an aspect of the system described herein to provide a user with the capability of designating multiple scene objects as an alternative.

The above aspects can be attained by a system that allows a user to create lineups of alternatives for a part of a scene. Once the alternatives are created, the user can click between them and the alternative selected in that lineup is shown in the scene. The user can create multiple lineups, each for a different part or overlapping parts of the scene, or for different materials applied to the same part, or for the same part in different positions. An alternative in a lineup is created by selecting scene contents and designating a lineup alternative to contain or receive the contents. The lineups are provided in a graphical user interface (GUI) that displays each alternative as a thumbnail image control where the image can be a compressed image of the scene containing the corresponding alternative. A user switches between alternatives in a lineup by clicking on a desired alternative control. The selected alternative in each lineup is marked with a visibility indicator indicating which alternative is the one displayed in the scene. Lineups and alternatives can be modified and deleted.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Embodiments of the present invention provide a graphical user interface (GUI) and underlying mechanisms to control loading and visibility of the objects within a 3D scene. The GUI is designed in such a manner that a designer can operate it without special training and it allows the designer to create sets of alternatives and easily and quickly switch between them to evaluate design options.

As noted above, the user interface is used to control displaying alternative configurations of a 3D scene of objects. The user interface is based on an iconic visual representation of an alternative—a collection of objects a user wants displayed or hidden as a unit, or displayed using particular materials, or in specific positions. Collections of one or more alternatives are grouped into "lineups" and are visually represented. Within a lineup, only one alternative can be active, that is, have its objects displayed. In the case of material lineups, the active alternative dictates which materials are applied to objects in the scene. For positional lineups, the active alternative dictates the position in which scene objects will be presented. An alternative may be made active by clicking on the iconic representation for it. Other GUI operations exist for creating, deleting and modifying the contents of alternatives and lineups, plus controlling the visibility of the iconic representations themselves.

Figure 1:
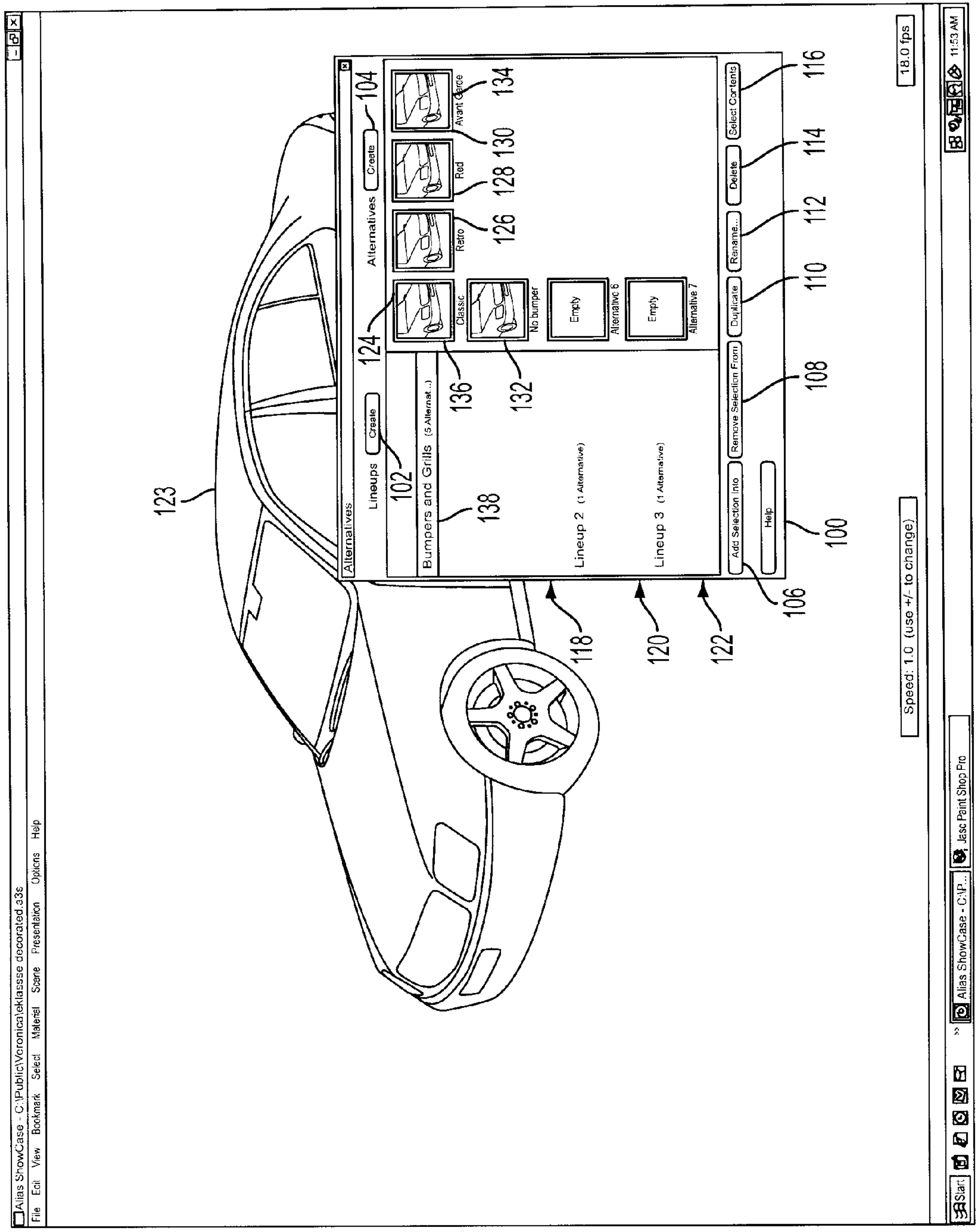
FIG. 1 illustrates an embodiment of a GUI of the system described herein.
Figure 2:
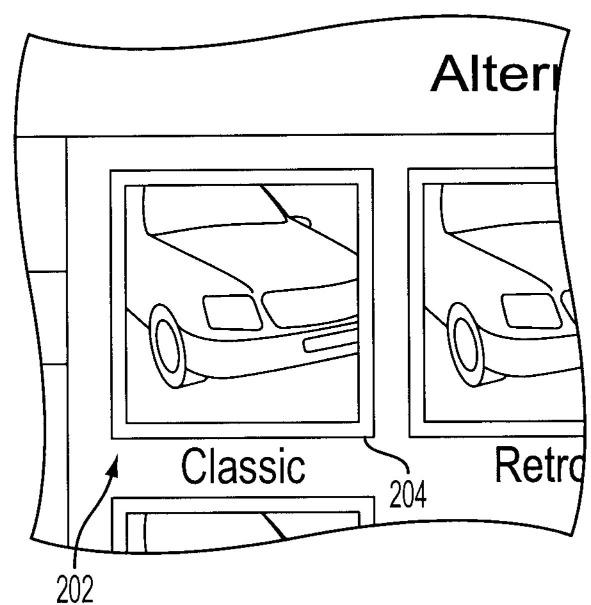
FIG. 2 shows a "visible" indicator of the GUI.

FIG. 1 depicts a "window" type embodiment of the graphical user interface (GUI) 100. The GUI 100 includes several buttons or controls that facilitate the creation of lineups 102 and alternatives 104 within a line up. Buttons for other operations, such as for adding 106 a selected object into a lineup and removing 108 a selected object from a lineup, duplicating 110 an alternative and its contents, so that it can be altered and become a new alternative, renaming 112 an alternative, deleting 114 an alternative, and selecting 116 the contents of an alternative so that it can be altered. Note, the altering of the contents of an object, such as changing the shape of an automobile wheel, is performed using conventional modeling tools, such as MAYA® available from Alias Systems Corp. of Toronto, Canada. The example of the GUI of FIG. 1 depicts three lineups 118, 120 and 122. The lineups 120 and 122 are empty. The lineup 118 has been selected and is one of bumpers and grills for an automobile 123 and includes five alternatives: classic style 124, retro style 126, red style 128, avant garde style 130 and 132, which is a no bumper alternative. Each of the alternatives is depicted in a thumbnail or swatch that is an image compressed version of or frame the particular alternative contents as in the scene to allow the contents to be somewhat recognized by the user. As noted, in this version of the swatch, the visual image is a small or compressed version of the part or alternative as it appears in the scene, that is, a bumper as it appears on the car. The visual image of the swatch can be an image of the part only (in this case the bumper) or it can be an icon representing the part. The swatch is also a button or control. Each swatch also has an associated name field 134, where the swatch 130 has a name field including the name "Avant Garde". The user is allowed to select (point and click) one of the swatches and the contents of that swatch are applied to the model, in this case the car 123. The example shown in FIG. 1 depicts the classic selection 124 having it's contents applied to the model 123. The contents are automatically applied by the functions of a system. This GUI 100 embodiment particularly depicts this selection by surrounding the swatch (124/202) with a colored, thickened or highlighted border 136/204 which can be seen more readily in FIG. 2. Other methods of indicating the selection to the user can also be used, such as using a special icon or enlarging the icon or coloring it while leaving the others monochrome. In the GUI 100 each lineup also has a lineup descriptor field, such as field 138 for the bumper/grill lineup where a description of the particular lineup can be provided.

Figure 3A:
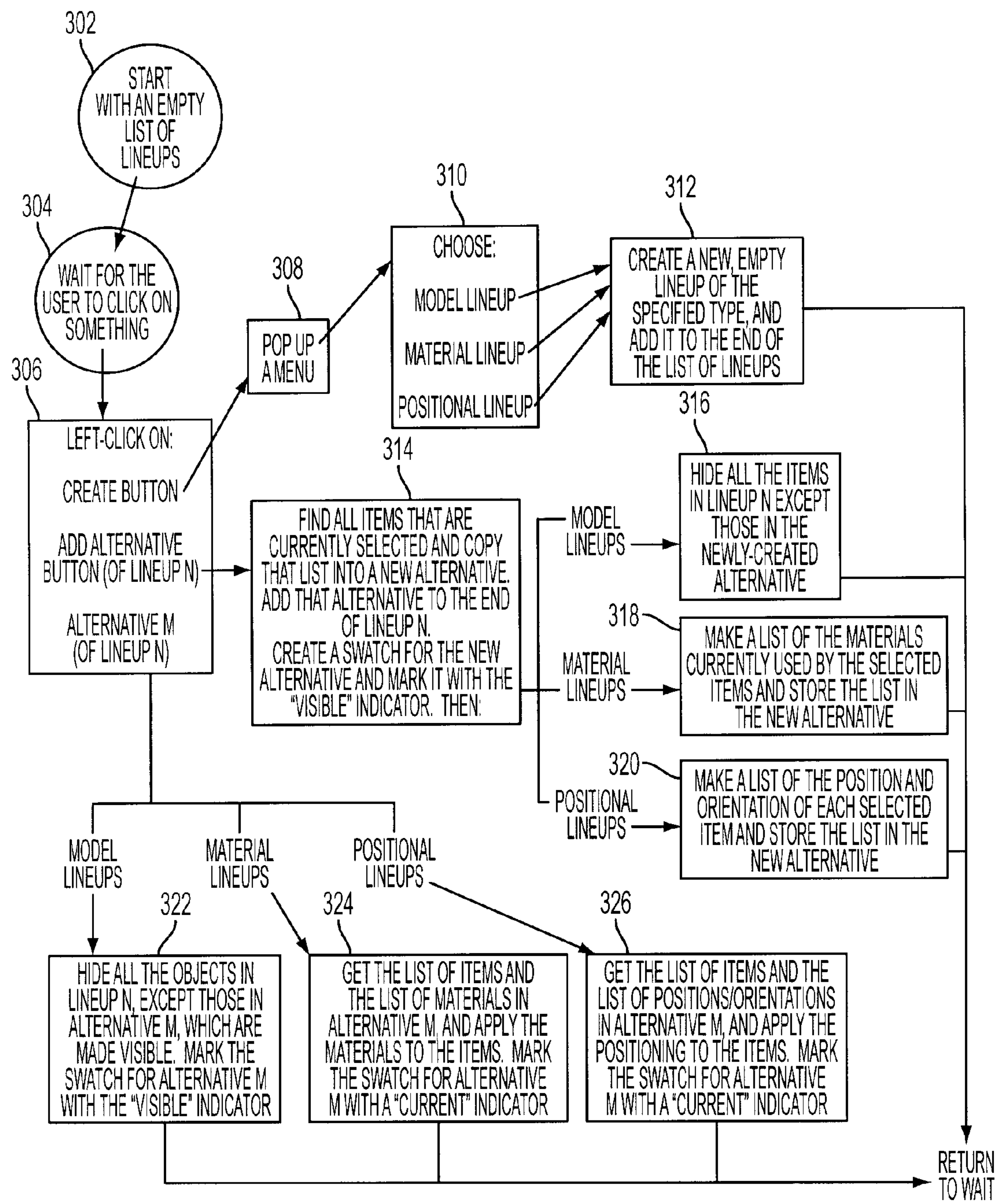
FIGS. 3*a* and 3*b* depict the flow of operations of the system.
Figure 3B:
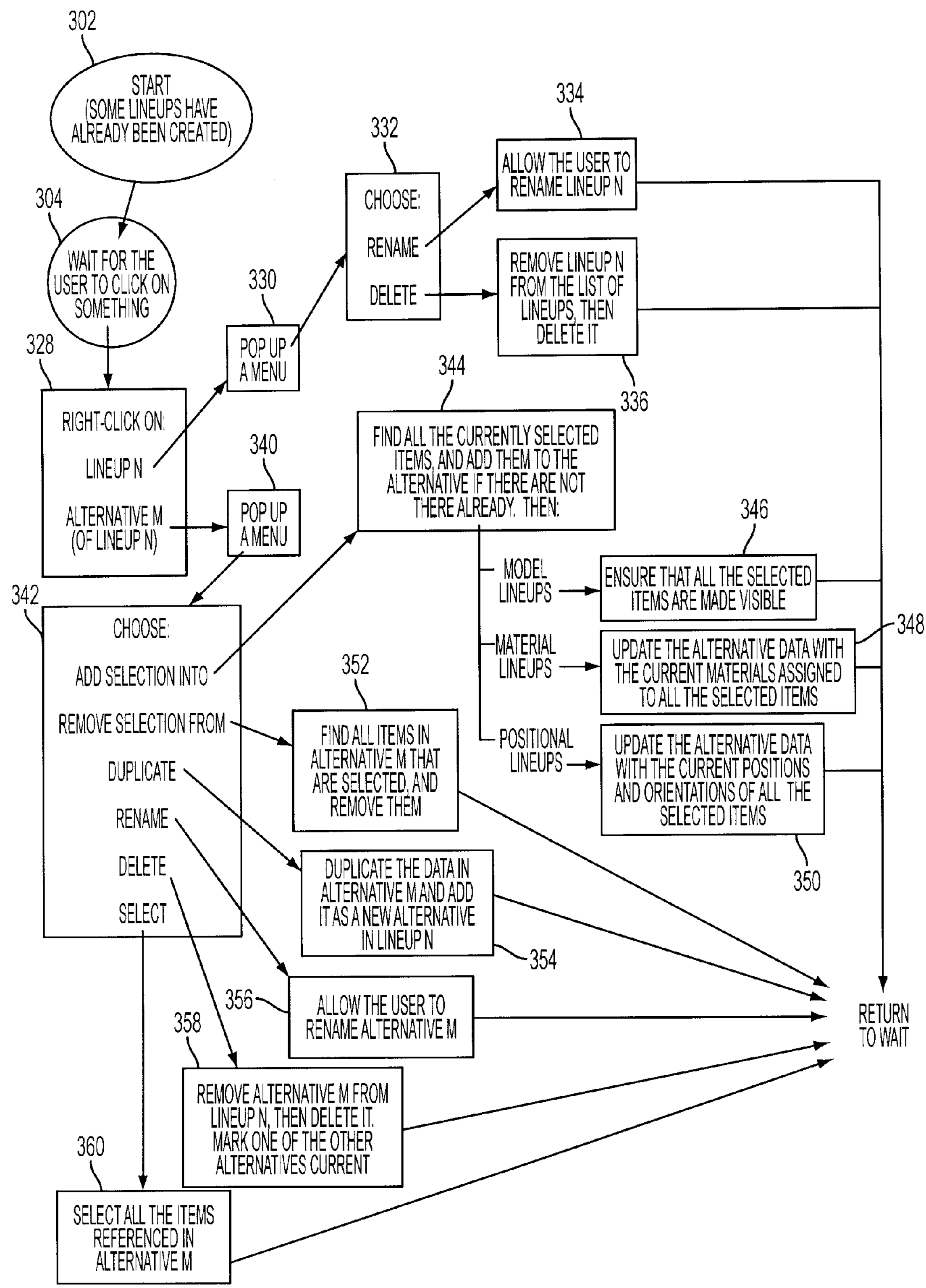
Figure 4A:
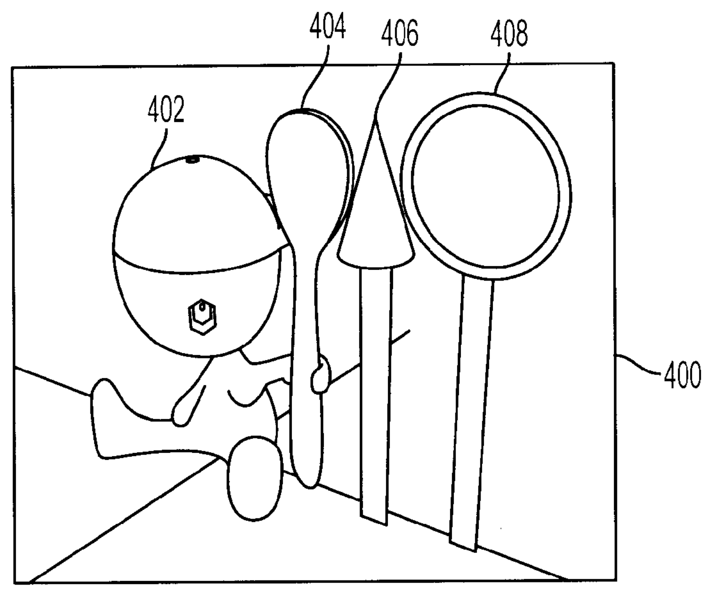
FIGS. 4*a*-4*m* illustrate the operations of creating lineup model alternatives.
Figure 4B:
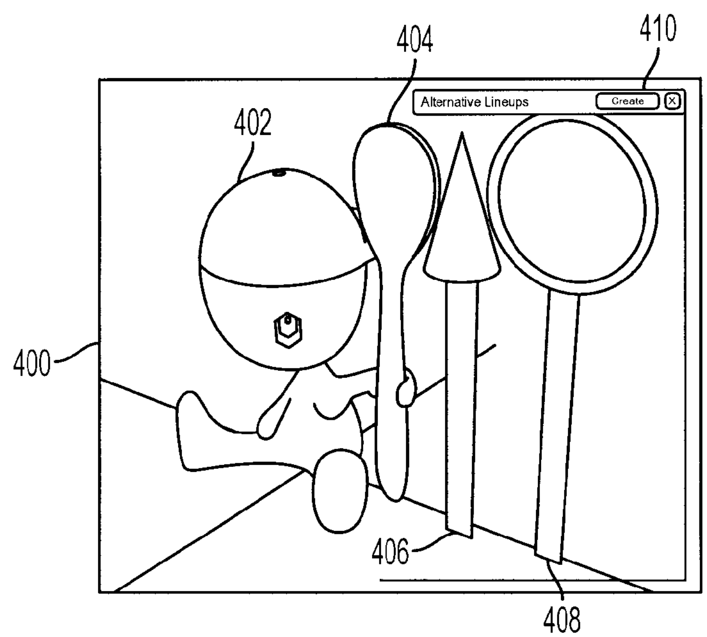
Figure 4C:
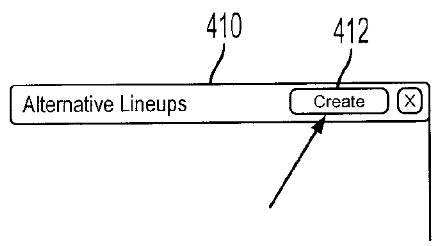
Figure 4D:
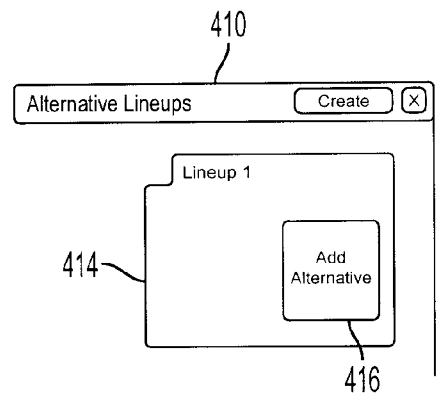

The process performed in association with the GUI of FIG. 1 is depicted in FIGS. 3*a* and 3*b*. This process 300 will be discussed in conjunction with FIGS. 4*a*-4*p*. At the start, the user has a scene (FIG. 4*a*) containing parts. For example, a 3D scene 400 with 3D objects, (as shown here a baby 402 with a hand for holding something, a spoon 404 being currently held, an arrow 406 and a magnifying glass 408), a photomontage with images, or any other collection of selectable objects. The user activates 302 (FIG. 3*a*) the alternatives user interface (GUI), such as the version of FIG. 1. To do this, the user can press a key or invoke a menu item. The user interface 410 can appear in a semi-transparent overlay, over the view of the scene (FIG. 4*b*). This interface could also appear in a separate window, or on a remote computer screen connected over a regular or wireless network, or on a PDA. The system then waits 304 for an action by the user. Since in this example, there are no lineups the user needs to create a new lineup. To do this, the user selects or left "clicks on" the create button 412 (104). The system recognizes 306 the selection and pops up 308 a menu that allows the user to select 310 the creation of a lineup for model, material or position. The system conventionally creates 312 (FIG. 4*d*) the graphic elements for a lineup file folder type representation 414 and an alternative button 416 (and the underlying data structures, such as a file folder to hold the contents of the alternatives of the swatches). The "add alternative" button acts as a placeholder for the alternative that is to be added. The new lineup is given a name/description that, as in this case, is typically merely a category descriptor ("Lineup") and a sequence number ("1").

Figure 4E:
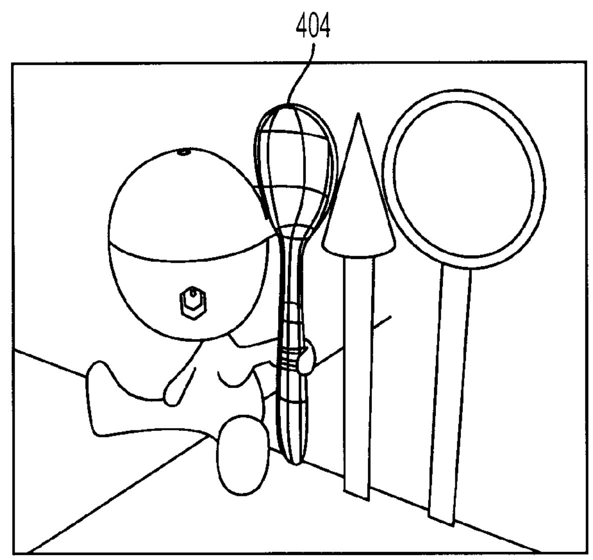
Figure 4F:
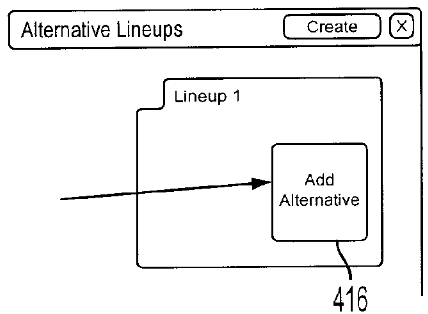
Figure 4G:
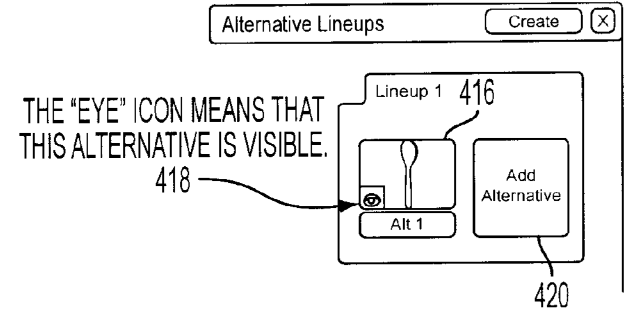

The user is then allowed to add one or more items to the lineup as an alternative. The user selects one or more items, such as spoon 404 (see FIG. 4*e*), and then activates the add alternative button 416 (FIG. 4*f*) to make a selection (306). Note, each time an alternative is added, the system creates a new button for the next possible alternative. The system obtains 314 all of the items currently selected by the user, adds the alternative to the end of the lineup, copies the list of items into the new alternative. The system also creates a swatch, or thumbnail image of the selected contents and overlays it on the button (FIG. 4*g*). The system also, in this GUI embodiment, adds a visibility "eye" icon 418 to the button swatch 416 (and a new alternative button 420 is created). The new alternative is given a name/description that, as in this case, is merely a category descriptor ("Alt") and a sequence number ("1"). For a model lineup all the alternatives except the new one are hidden 316. For a material lineup, nothing is hidden. Instead, the system records all the selected objects along with their current material assignments, and stores 318 that in the alternative. Similarly, for positional lineups, the system records all the selected objects and their current positions, and stores that 320.

Figure 4H:
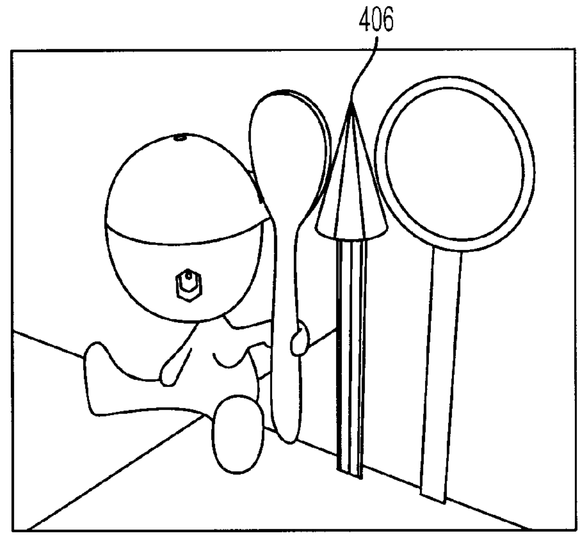
Figure 4I:
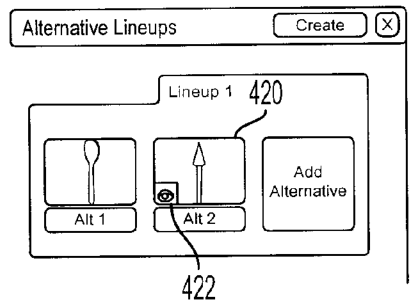
Figure 4J:
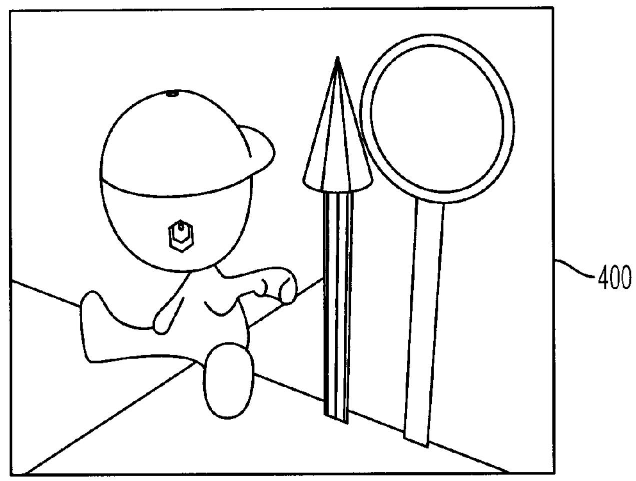
Figure 4K:
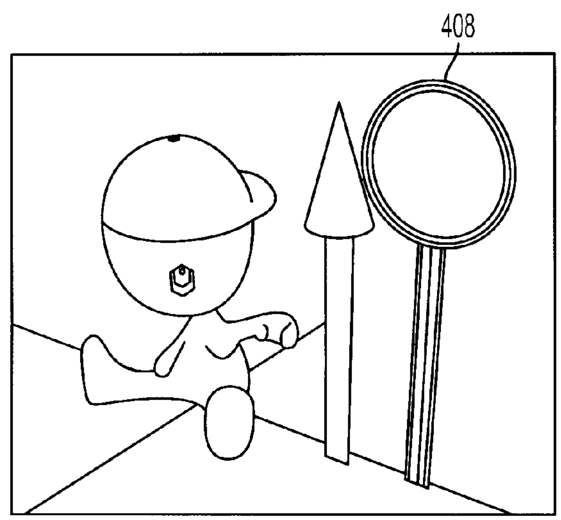
Figure 4L:
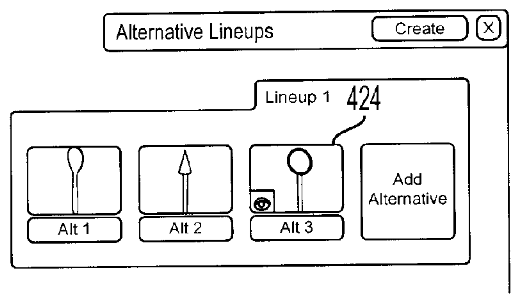
Figure 4M:
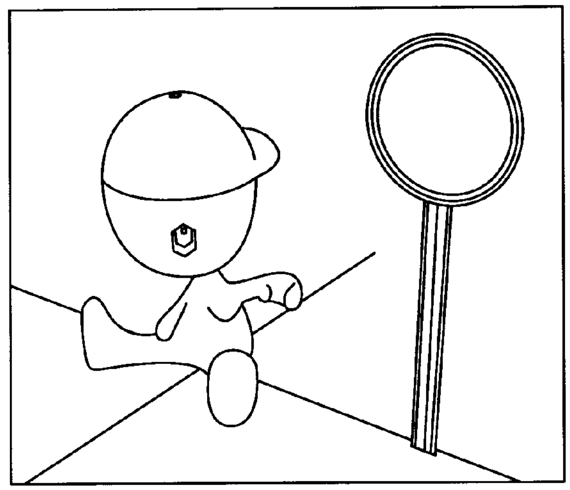
Figure 4N:
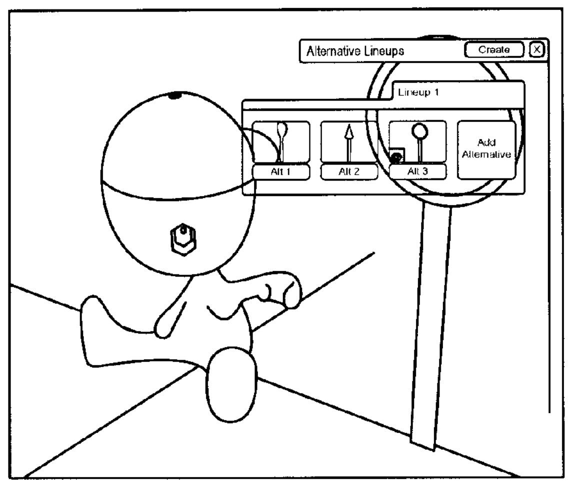
FIGS. 4*n*-4*p* depicts switching between the alternatives created as shown in FIGS. 4*a*-4*m*.
Figure 4O:
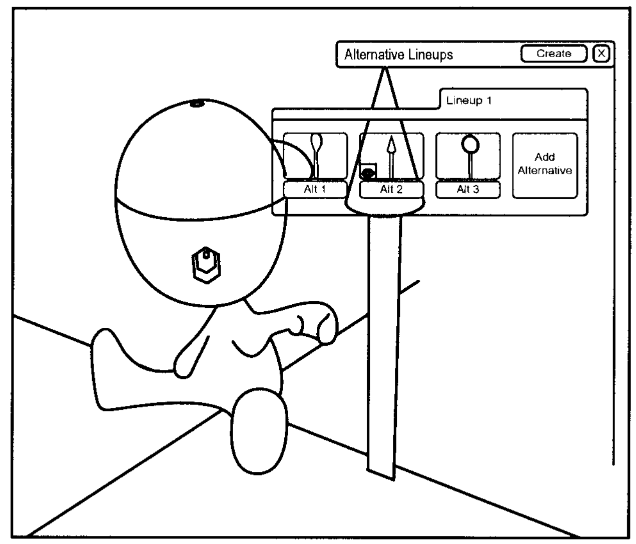
Figure 4P:
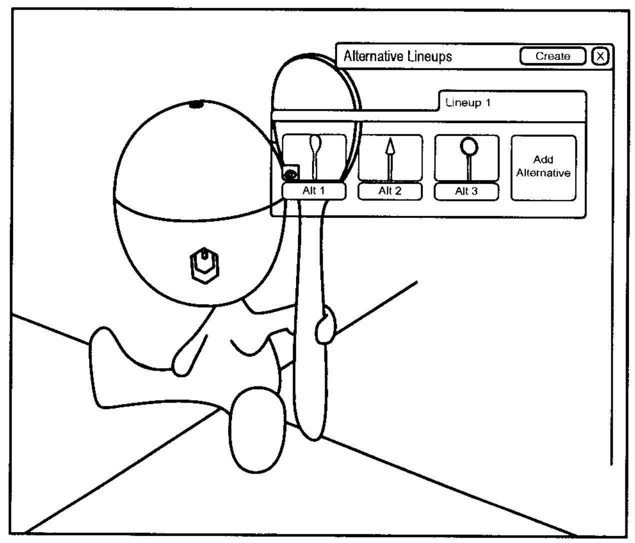

The user then selects a different object, such as arrow 406 (FIG. 4*h*) and adds it to the lineup by selecting the button 420. The system makes a new alternative from the selected geometry and displays it in the lineup (FIG. 4*i*). The new "arrow" alternative is marked visible with icon 422, and the spoon is no longer marked visible. Since the spoon is not the visible alternative any more, it is hidden in the scene 400 (FIG. 4*j*). In a typical scenario, the user would now move the arrow 406 to take the place of the spoon 404 in the scene. The user can continue to select different objects in the scene and create lineup alternatives. In this example, the user has selected the magnifying glass 408 (FIG. 4*k*), added it as an alternative 424. The system has then marked it as visible and consequently hid the other alternatives of this lineup (FIG. 4*m*). For a material lineup, the user would change the materials assigned to the objects in the scene, then reselect them and create a new alternative. Similarly for positional lineups, where the user would move objects in the scene, then select them and create a new alternative. The user can now switch between the different alternatives by selecting the appropriate buttons as shown in FIGS. 4*n*, 4*o* and 4*p*. That is, the user can now switch between the alternatives by simply clicking on them. When the user switches to an alternative, it becomes visible and all the other alternatives in the lineup are hidden. The visible alternative is marked with the "eye" icon (the form of this icon varies for material and positional alternatives, to help distinguish them from one another). The user can have any number of lineups. Only one alternative in each lineup is visible. These alternatives can be used when the user is doing a presentation, to show the different possibilities of a model. For material alternatives, activating the appropriate button will assign all the recorded materials to the recorded objects. Similarly, selecting a positional alternative will move all the recorded objects to their recorded positions.

As depicted in FIG. 3, if the user selects (left clicks—306) an alternative in another model lineup, the other alternatives in that model lineup are hidden 322, and the visible alternative is marked. Similarly, for a different material lineup the different material is applied 324 and the swatch is marked visible. Again, similarly for the positional lineup, the selected positions and orientations are obtained and applied 326 and the alternative indicated.

The user can also right click 328 (FIG. 3*b*) on a lineup and a pop-up menu conventionally arises 330 that allows a user to chose 332 to rename 334 a lineup where the system conventionally accesses the name field of the lineup data structure and changes its contents or to remove 336 it where the system conventionally deletes it.

A right click can over an alternative (328) also triggers 340 a pop-up menu that allows the user to chose 342 whether to add 344 a selection of objects to an existing alternative where the system locates the objects that are currently selected and adds them to the currently visible alternative. For model lineups the system makes 346 all the selected items visible, for the material lineups updates 348 with the current materials and for the positional lineups updates 350 with the current position and orientation. The user can also chose to remove 352 a selection from an alternative where the system locates the objects that are selected and removes them from the designated visible alternative. The user can further chose to duplicate 354 an alternative, rename 356 an alternative, remove 358 an alternative completely and select 360 all objects of an alternative.

Figure 5A:
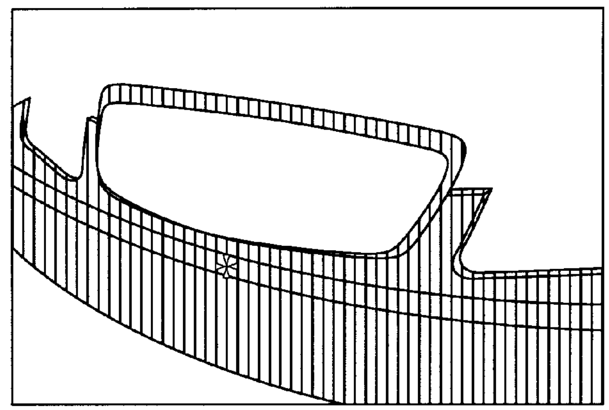
FIG. 5*a*-5*k* shows creating material lineup alternatives.
Figure 5B:
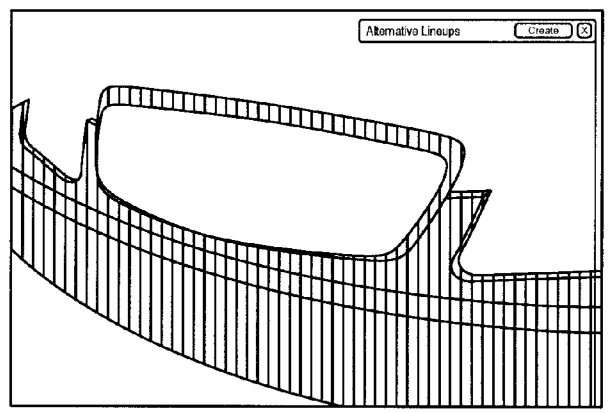
Figure 5C:
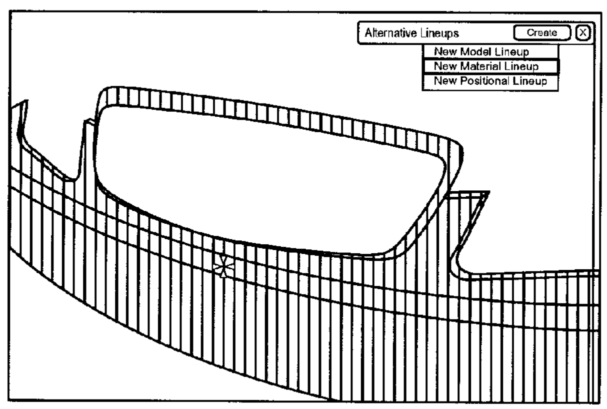
Figure 5D:
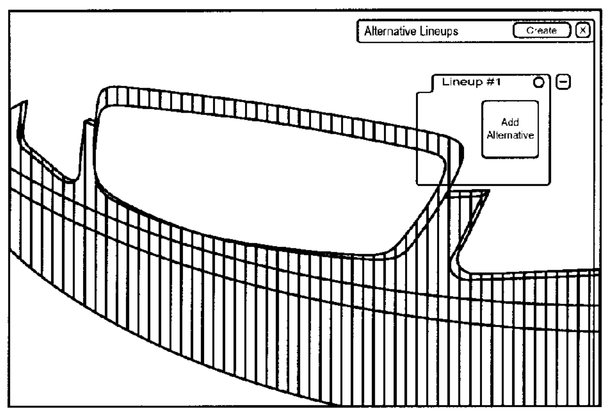
Figure 5E:
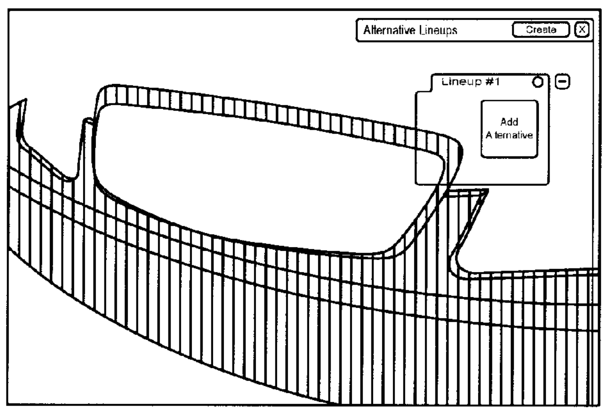
Figure 5F:
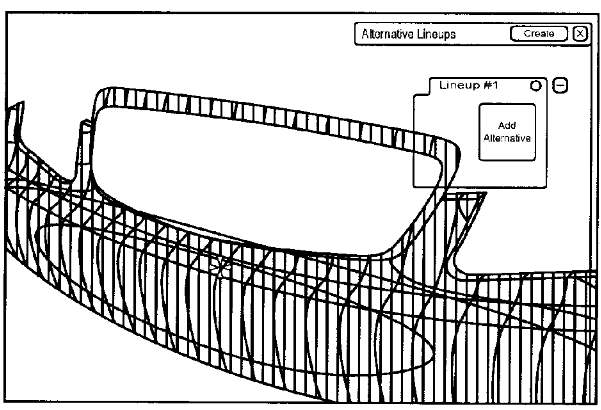
Figure 5G:
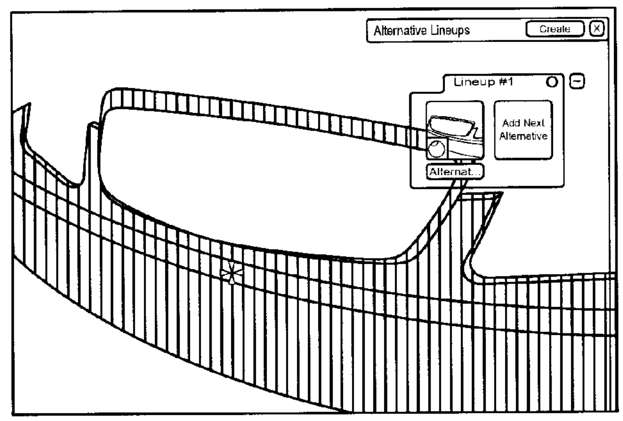
Figure 5H:
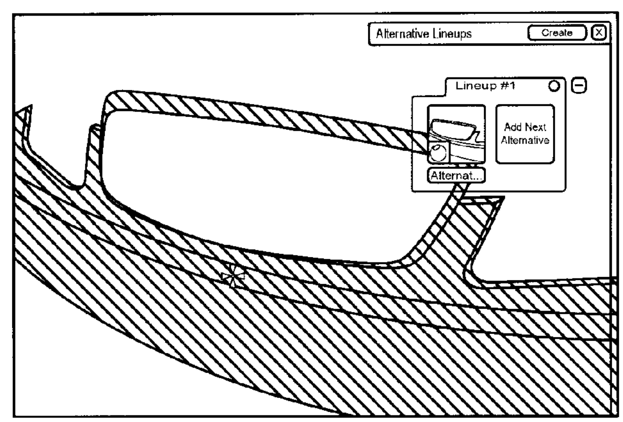
Figure 5I:
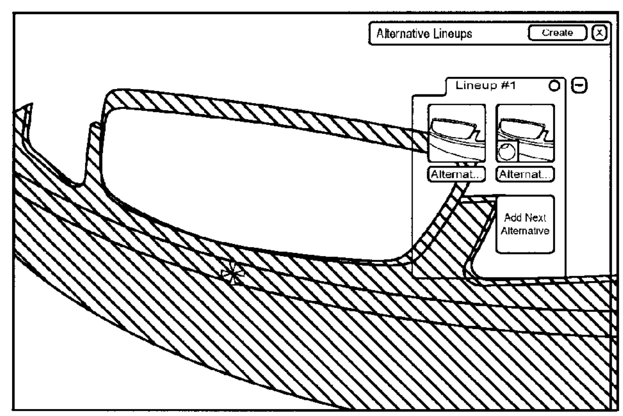
Figure 5J:
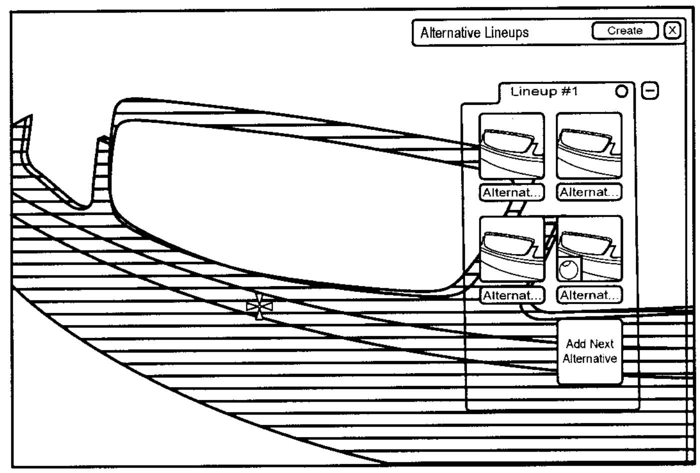
Figure 5K:
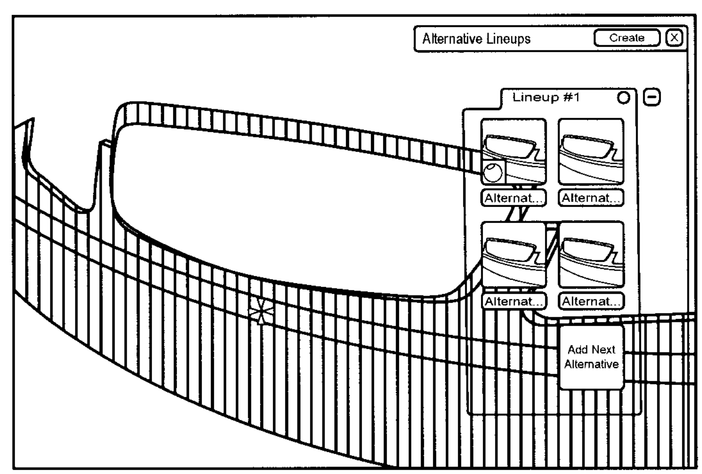

FIGS. 5*a*-5*k* illustrates the creation of material alternatives and flow within FIGS. 3*a* and 3*b* can be seen. In the beginning (FIG. 5*a*), the user has a scene containing parts. For example, a 3D scene with 3D objects (as shown here), a photomontage with images, or any other collection of selectable objects. To bring up the alternatives user interface the user can press a key or invoke a menu item to do this. The user interface appears (FIG. 5*b*) in a semi-transparent overlay, over the view of the scene. To create a new material lineup, the user clicks on the "Create" button, is given a choice (FIG. 5*c*) of lineup types and selects "New Material Lineup". The system creates and displays a new, empty lineup (FIG. 5*d*). The user assigns materials to the objects in the scene, to get the first look wanted (FIG. 5*e*). The user selects all the objects whose materials the user wishes to save in the alternative (FIG. 5*f*). The user clicks on the "Add Alternative" button in a lineup and the system makes a new alternative from the selected materials, and displays it on in the lineup (FIG. 5*g*). The user assigns a different set of materials to the objects, to get a different look (FIG. 5*h*). The user re-selects these objects, and clicks on the "Add Alternative" button. The system makes a new alternative from the selected geometry and displays it in the lineup with its new materials (FIG. 5*i*). The steps (FIGS. 5*h* and 5*i*) are repeated until the user has all the alternatives wanted (FIG. 5*j*). The scene is now set up. To use the alternatives the user clicks on them (FIG. 5*k*). When the user clicks on each alternative, the models go back to the materials that were stored in that alternative, and the current alternative is marked with an icon to show that it is current.

Figure 6:
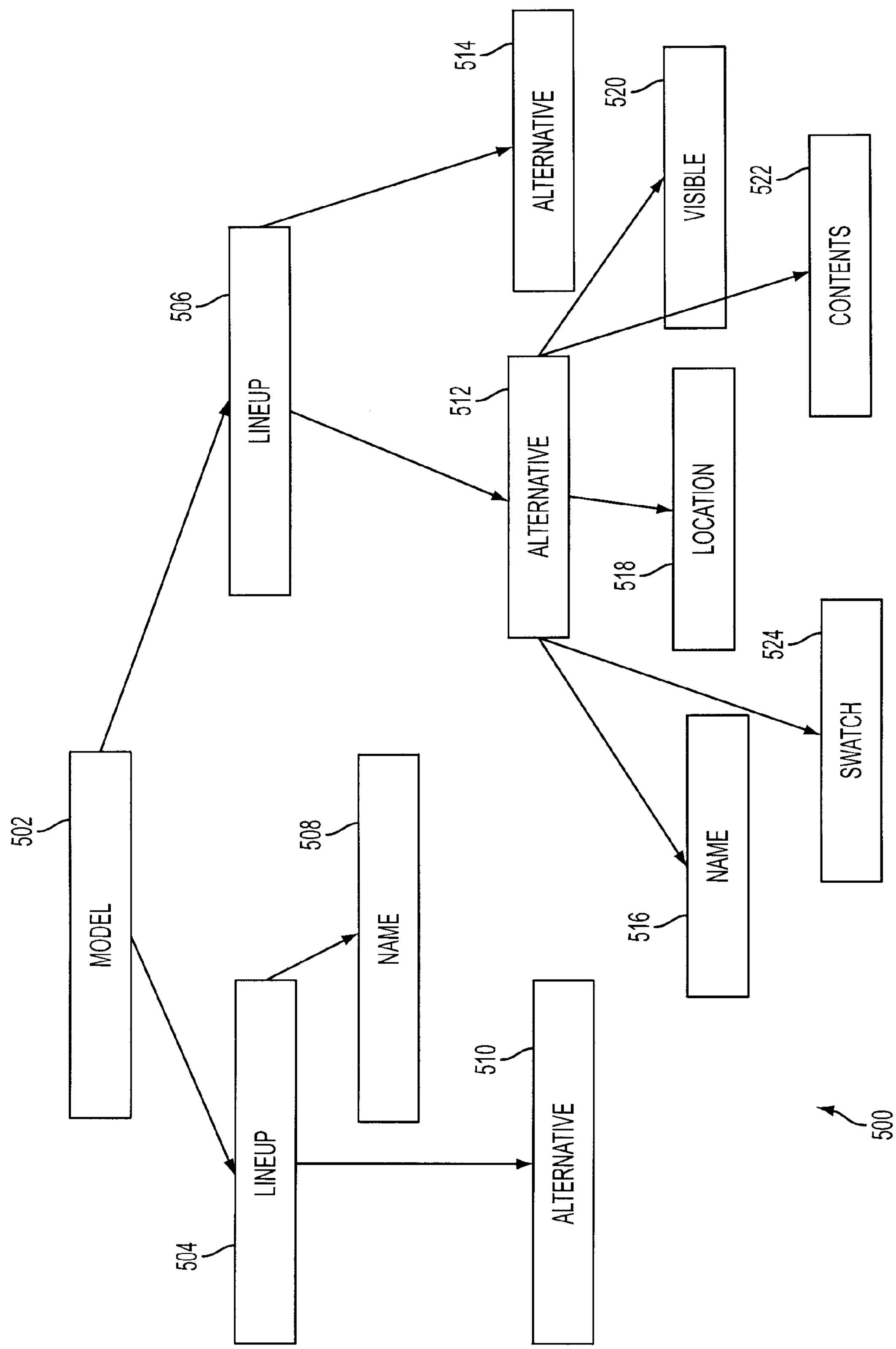
FIG. 6 illustrates a possible data structure of the system.

FIG. 6 illustrates a data structure 500 for a model line up that can be used for the system described herein. A model entry 502 points to the lineups 504 and 506 that exist for the model. A lineup can include a name field or entry 508. Each lineup can point to its corresponding alternatives 510 and 512, 514. An alternative can include a name entry 516, a location entry 508 indicating where the alternative is located in the lineup. Visibility is preferably indicated by an index under the lineup 506 that says which of the children alternatives is the visible one. Alternatively by a visible entry 520 can be provided that indicates whether the alternative is the visible alternative. Contents 522 of the alternative are stored along with the swatch image 524. For models, the alternative contents include pointers to models. In the case of materials alternatives, the contents 522 include a list of pairs, objects plus their material. For positional alternatives, the contents include objects plus their positions.

Figure 7:
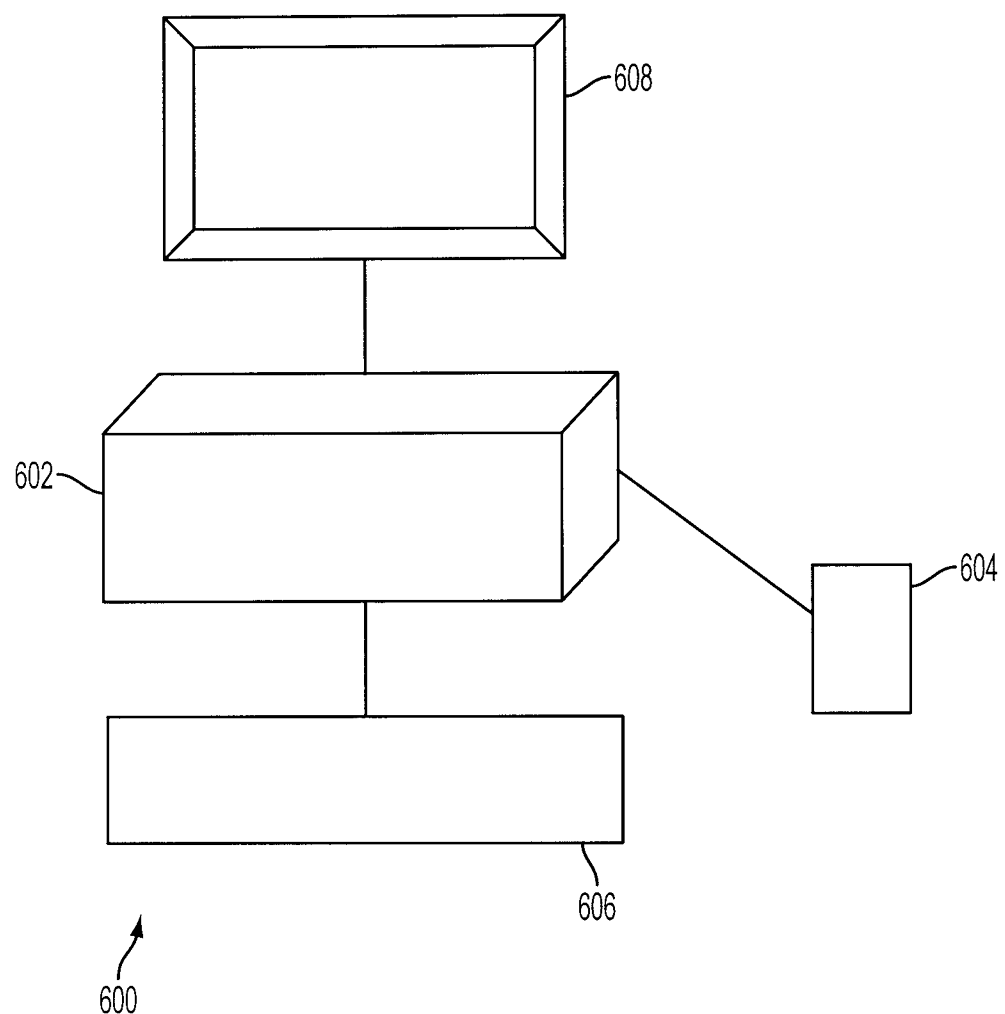
FIG. 7 shows system hardware.

FIG. 7 illustrates typical hard components of the system 600 discussed herein. The system 600 includes a desktop type computer 602 that performs the processes discussed herein based on inputs from an input device such as a mouse 604 or keyboard 606 and displays the results—model, lineups, alternatives, etc. on a display 608.

Figure 8:
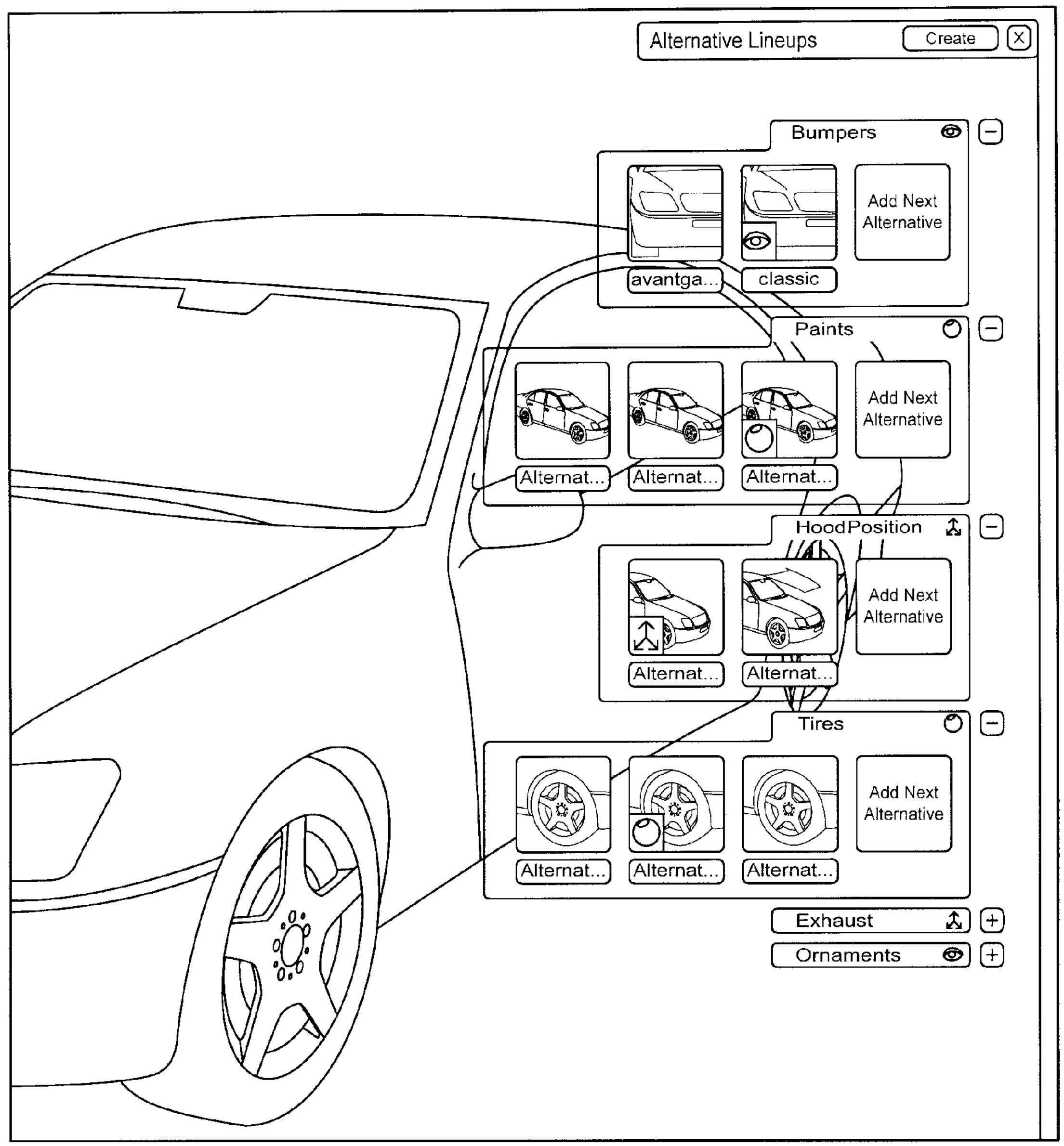
FIGS. 8-12 illustrate GUI embodiments.
Figure 9:
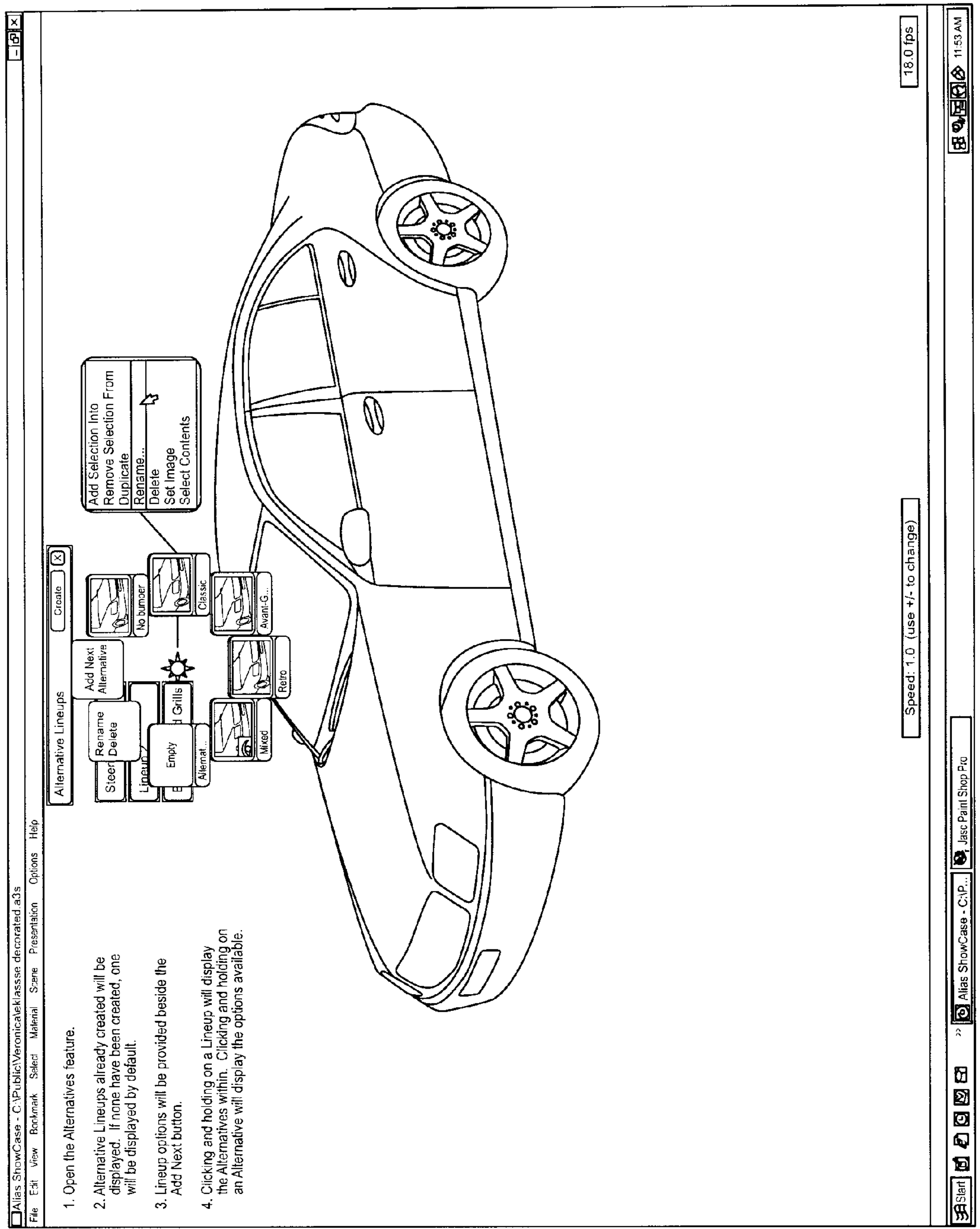
Figure 10:
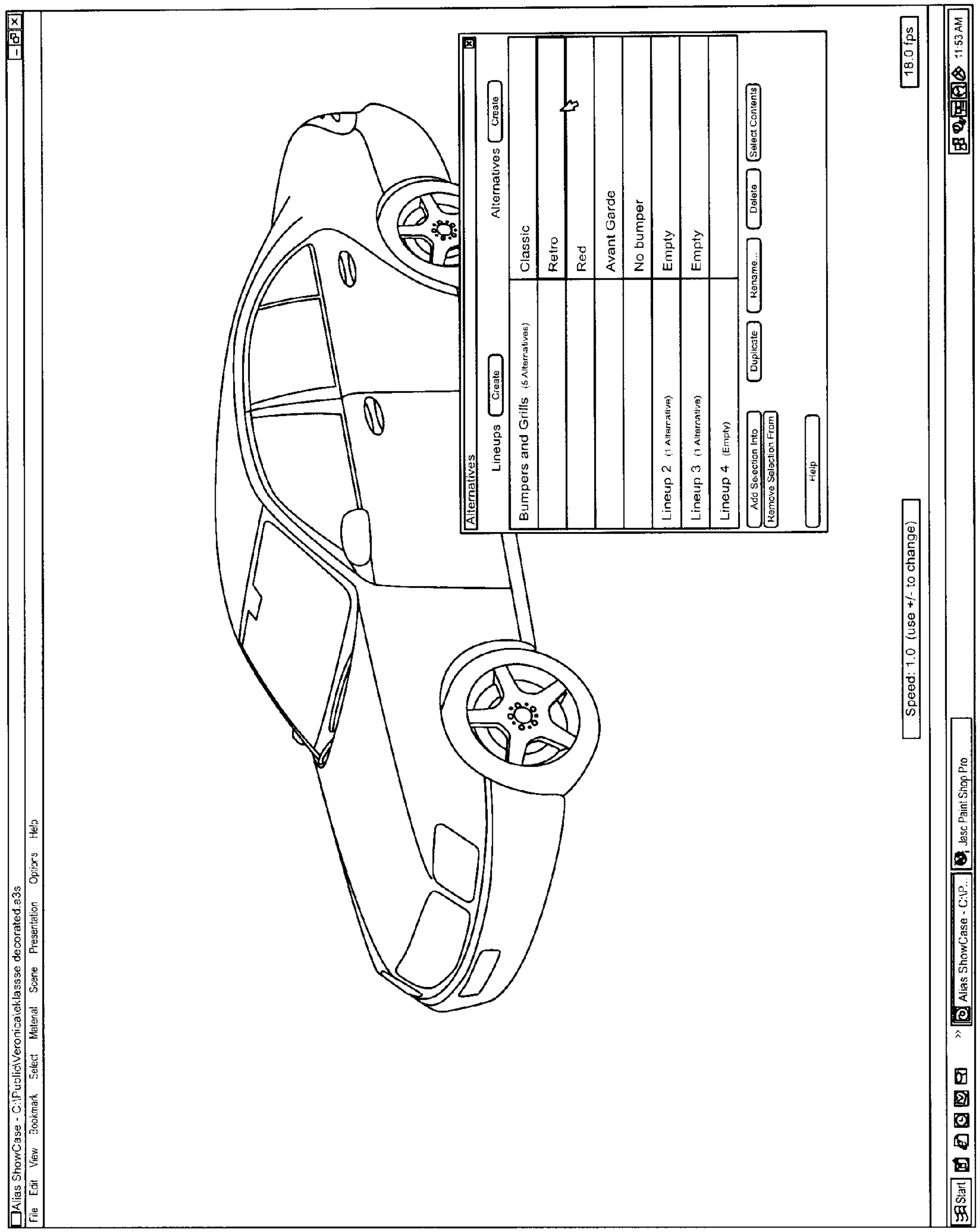
Figure 11:
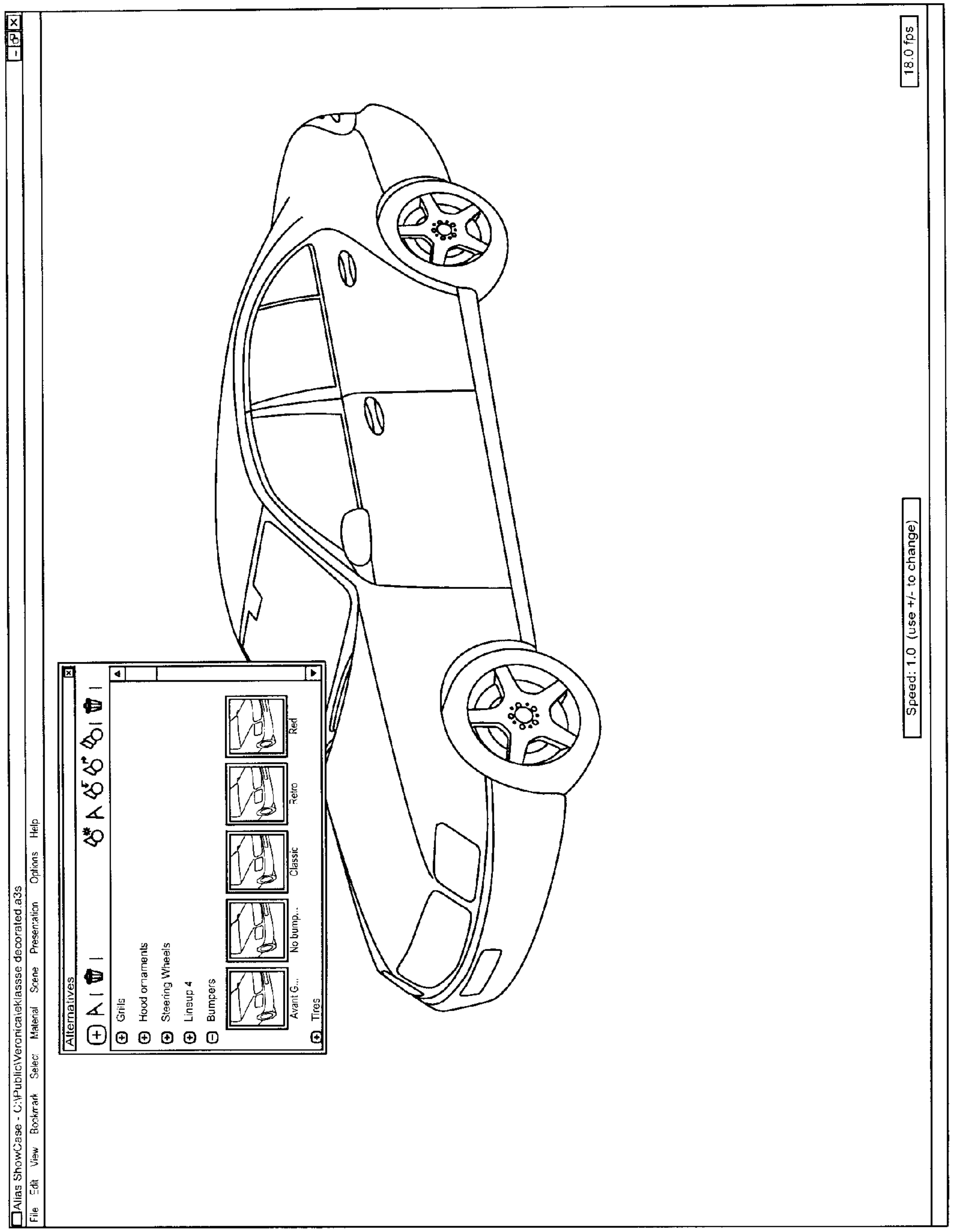
Figure 12:
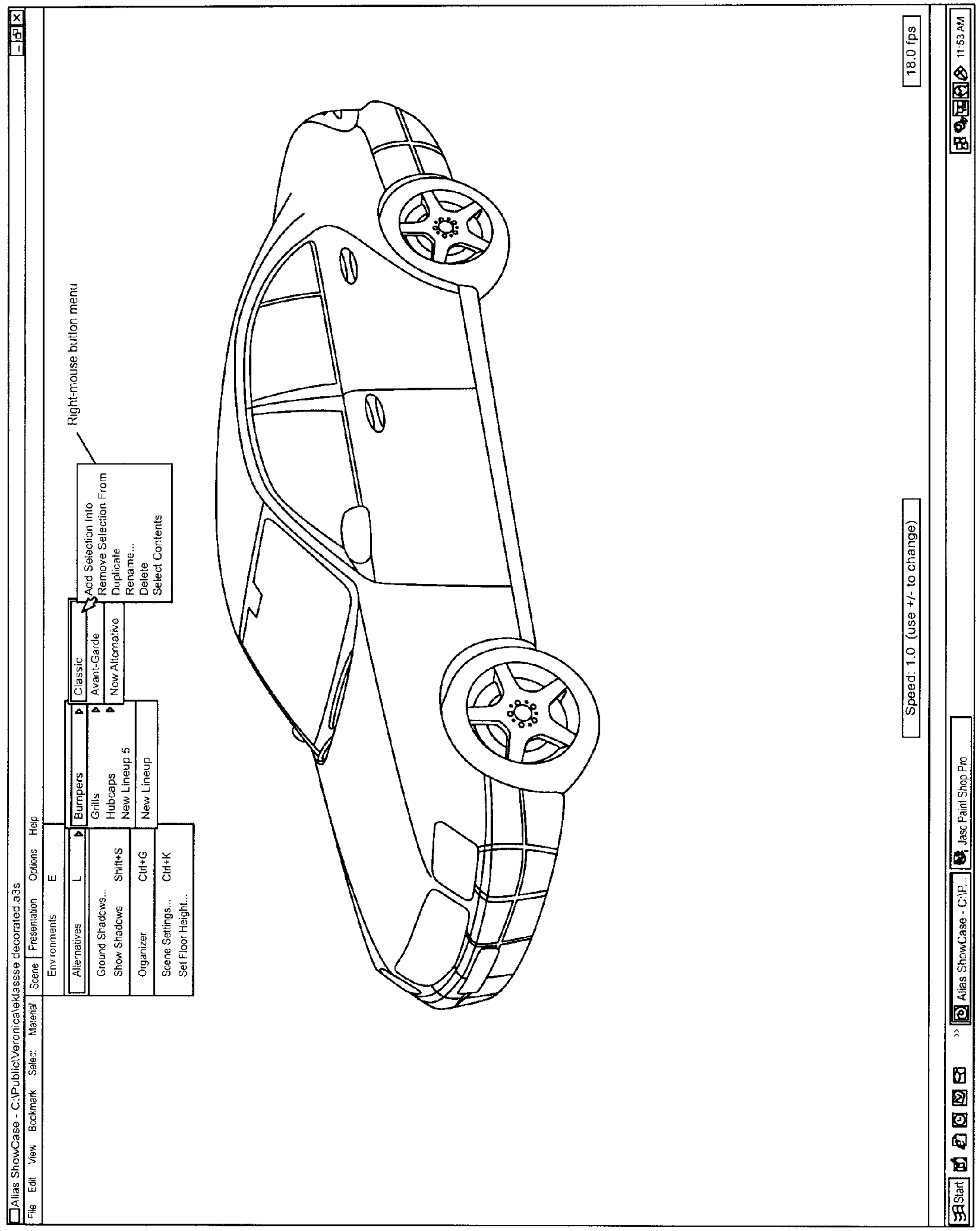

FIG. 8 illustrates a "folders" type GUI embodiment with semitransparent lineups and alternatives. This embodiment also illustrates that the visible lineups of the model can have a visibility indicator, in this case the eye icon. FIG. 8 also shows the different kinds of lineups can be demarcated by different identifying icons; eyes for the model lineups, spheres for the material lineups, and crosshairs for the positional lineups. FIG. 9 shows a GUI embodiment modeled on a marking menu. FIG. 10 illustrates a text only window type embodiment. FIG. 11 depicts a tree type GUI embodiment. FIG. 12 illustrates a cascading menu type embodiment.

The present invention has been described with respect to using a desktop system to perform and display the results of the operations of the system. It is also possible to implement this over the Internet or local-area network so that a presentation can take advantage of the high processing speed of a server for integrating alternatives into a complex 3D model.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method for generating alternative configurations for a three-dimensional (3D) scene, the method comprising:

creating a first lineup related to a first category;

generating a first plurality of alternatives for the first lineup, wherein each alternative included in the first plurality of alternatives is associated with one or more objects included in the 3D scene;

creating a second lineup related to a second category that is associated with a first alternative included in the first plurality of alternatives;

generating a second plurality of alternatives for the second lineup, wherein each alternative included in the second plurality of alternatives is associated with the one or more objects included in the 3D scene that are associated with the first alternative; and displaying one of the alternatives included in the second plurality of alternatives on a display, wherein the first lineup comprises a model lineup, and each of the first alternative and a second alternative included in the first plurality of alternatives is associated with one or more different objects included in the 3D scene, and wherein the second lineup comprises a positional lineup, and each alternative included in the second plurality of alternatives includes a different set of positions or orientations corresponding to the one or more objects included in the 3D scene that are associated with the first alternative.

2. The method of claim 1, further comprising making visible the one or more objects associated with the first alternative and hiding the one or more objects associated with the second alternative in response to a selection of the one of the alternatives included in the second plurality of alternatives for display.

3. A method for generating alternative configurations for a three-dimensional (3D) scene, the method comprising:

creating a first lineup related to a first category;

generating a first plurality of alternatives for the first lineup, wherein each alternative included in the first plurality of alternatives is associated with one or more objects included in the 3D scene;

creating a second lineup related to a second category that is associated with a first alternative included in the first plurality of alternatives;

generating a second plurality of alternatives for the second lineup, wherein each alternative included in the second plurality of alternatives is associated with the one or more objects included in the 3D scene that are associated with the first alternative; and displaying one of the alternatives included in the second plurality of alternatives on a display, wherein the first lineup comprises a material lineup, and each of the first alternative and a second alternative included in the first plurality of alternatives is associated with the same one or more objects included in the 3D scene, and wherein the second lineup comprises a positional lineup, and each alternative included in the second plurality of alternatives includes a different set of positions corresponding to the one or more objects included in the 3D scene that are associated with the first alternative.

4. A non-transitory computer-readable medium including instructions that, when executed by a processor, cause the processor to generate alternative configurations for a three-dimensional (3D) scene, by performing the steps of:

creating a first lineup related to a first category;

generating a first plurality of alternatives for the first lineup, wherein each alternative included in the first plurality of alternatives is associated with one or more objects included in the 3D scene;

creating a second lineup related to a second category that is associated with a first alternative included in the first plurality of alternatives;

generating a second plurality of alternatives for the second lineup, wherein each alternative included in the second plurality of alternatives is associated with the one or more objects included in the 3D scene that are associated with the first alternative; and displaying one of the alternatives included in the second plurality of alternatives on a display, wherein the first lineup comprises a model lineup, and each of the first alternative and a second alternative included in the first plurality of alternatives is associated with one or more different objects included in the 3D scene, and wherein the second lineup comprises a positional lineup, and each alternative included in the second plurality of alternatives includes a different set of positions or orientations corresponding to the one or more objects included in the 3D scene that are associated with the first alternative.

5. The computer-readable medium of claim 4, further comprising making visible the one or more objects associated with the first alternative and hiding the one or more objects associated with the second alternative in response to a selection of the one of the alternatives included in the second plurality of alternatives for display.

6. A non-transitory computer-readable medium including instructions that, when executed by a processor, cause the processor to generate alternative configurations for a three-dimensional (3D) scene, by performing the steps of:

creating a first lineup related to a first category;

generating a first plurality of alternatives for the first lineup, wherein each alternative included in the first plurality of alternatives is associated with one or more objects included in the 3D scene;

creating a second lineup related to a second category that is associated with a first alternative included in the first plurality of alternatives;

generating a second plurality of alternatives for the second lineup, wherein each alternative included in the second plurality of alternatives is associated with the one or more objects included in the 3D scene that are associated with the first alternative; and displaying one of the alternatives included in the second plurality of alternatives on a display, wherein the first lineup comprises a material lineup, and each of the first alternative and a second alternative included in the first plurality of alternatives is associated with the same one or more objects included in the 3D scene, and wherein the second lineup comprises a positional lineup, and each alternative included in the second plurality of alternatives includes a different set of set of positions corresponding to the one or more objects included in the 3D scene that are associated with the first alternative.

7. A method for generating alternative configurations for a three-dimensional (3D) scene, the method comprising:

generating a model lineup for the 3D scene that includes a plurality of first alternatives, wherein each alternative in the first plurality of alternatives is associated with a different set of objects included in the 3D scene;

generating a material lineup for the 3D scene that includes a plurality of second alternatives, wherein each alternative in the second plurality of alternatives specifies a different material applied to a first designated set of objects in the 3D scene; and generating a positional lineup for the 3D scene that includes a plurality of third alternatives, wherein each alternative in the third plurality of alternatives specifies at least one of a different position and a different orientation applied to a second designated set of objects in the 3D scene, wherein when a first alternative included in the first plurality of alternatives is selected, only the set of objects associated with the first alternative in the first plurality of alternatives is displayed on a display, wherein when a first alternative included in the second plurality of alternatives is selected, the material specified for the first alternative in the second plurality of alternatives is applied to the first designated set of objects in the 3D scene, and wherein when a first alternative included in the third plurality of alternatives is selected, the at least one of the different position and the different orientation specified for the first alternative in the third plurality of alternatives is applied to the second designated set of objects in the 3D scene.

8. A non-transitory computer-readable storage medium including instructions that, when executed by a processor, cause the processor to generate alternative configurations for a three-dimensional (3D) scene, by performing the steps of:

generating a model lineup for the 3D scene that includes a plurality of first alternatives, wherein each alternative in the first plurality of alternatives is associated with a different set of objects included in the 3D scene;

generating a material lineup for the 3D scene that includes a plurality of second alternatives, wherein each alternative in the second plurality of alternatives specifies a different material applied to a first designated set of objects in the 3D scene; and generating a positional lineup for the 3D scene that includes a plurality of third alternatives, wherein each alternative in the third plurality of alternatives specifies at least one of a different position and a different orientation applied to a second designated set of objects in the 3D scene, wherein when a first alternative included in the first plurality of alternatives is selected, only the set of objects associated with the first alternative in the first plurality of alternatives is displayed on a display, wherein when a first alternative included in the second plurality of alternatives is selected, the material specified for the first alternative in the second plurality of alternatives is applied to the first designated set of objects in the 3D scene, and wherein when a first alternative included in the third plurality of alternatives is selected, the at least one of the different position and the different orientation specified for the first alternative in the third plurality of alternatives is applied to the second designated set of objects in the 3D scene.

* * * * *